(12) United States Patent
Li et al.

(10) Patent No.: US 11,127,319 B2
(45) Date of Patent: Sep. 21, 2021

(54) FLEXIBLE DISPLAY PANEL, MANUFACTURING METHOD THEREOF AND FLEXIBLE DISPLAY APPARATUS

(71) Applicant: BOE TECHNOLOGY GROUP CO., LTD., Beijing (CN)

(72) Inventors: Zhao Li, Beijing (CN); Pao Ming Tsai, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 534 days.

(21) Appl. No.: 15/764,580

(22) PCT Filed: Aug. 11, 2017

(86) PCT No.: PCT/CN2017/097064
§ 371 (c)(1),
(2) Date: Mar. 29, 2018

(87) PCT Pub. No.: WO2018/153035
PCT Pub. Date: Aug. 30, 2018

(65) Prior Publication Data
US 2020/0251025 A1    Aug. 6, 2020

(30) Foreign Application Priority Data
Feb. 21, 2017    (CN) .......................... 201710094071.6

(51) Int. Cl.
*G09F 9/30*    (2006.01)
*H01L 27/32*    (2006.01)
(Continued)

(52) U.S. Cl.
CPC ............ *G09F 9/301* (2013.01); *H01L 27/323* (2013.01); *H01L 51/5246* (2013.01);
(Continued)

(58) Field of Classification Search
CPC ... G09F 9/301; H01L 51/5246; H01L 27/323; H01L 51/5293; H01L 51/56; H01L 2251/303; H01L 2251/5338
See application file for complete search history.

(56) References Cited

U.S. PATENT DOCUMENTS 5,167,987 A    12/1992 Yu
7,064,368 B2    6/2006 Tanaka et al.
(Continued)

FOREIGN PATENT DOCUMENTS

CN    104779266 A    7/2015
CN    105807359 A    7/2016
(Continued)

OTHER PUBLICATIONS

Indian Office Action dated May 12, 2020; Appln. No. 201847011667.
(Continued)

*Primary Examiner* — Su C Kim (57) ABSTRACT

A flexible display panel, a method for manufacturing a flexible display panel and a flexible display apparatus are provided. The flexible display panel includes: a flexible substrate; a flexible display screen disposed on the flexible substrate; a protection film disposed at a side of the flexible display screen away from the flexible substrate; and a connection layer sandwiched between the flexible display screen and the protection film, and the connection layer includes at least one layer of hyperelasticity film.

17 Claims, 3 Drawing Sheets

(51) Int. Cl.
*H01L 51/52* (2006.01)
*H01L 51/56* (2006.01)

(52) U.S. Cl.
CPC .......... *H01L 51/5293* (2013.01); *H01L 51/56* (2013.01); *H01L 2251/303* (2013.01); *H01L 2251/5338* (2013.01)

(56) References Cited

U.S. PATENT DOCUMENTS

| | | | |
|---|---|---|---|
| 10,064,269 | B2 | 8/2018 | Rogers et al. |
| 10,292,261 | B2 | 5/2019 | Rogers et al. |
| 10,505,151 | B2 | 12/2019 | Wang et al. |
| 2003/0099027 | A1* | 5/2003 | Shigehiro ............... G02F 1/167 359/296 |
| 2004/0067710 | A1 | 4/2004 | Tsujiyama et al. |
| 2004/0179165 | A1* | 9/2004 | Kinoshita ............. H01L 51/524 349/158 |
| 2008/0026206 | A1* | 1/2008 | Matsumoto ............. G06F 3/041 428/327 |
| 2014/0168746 | A1* | 6/2014 | Yamamoto ............. G02F 1/155 359/275 |
| 2014/0367644 | A1 | 12/2014 | Song et al. |
| 2015/0200375 | A1 | 7/2015 | Kim et al. |
| 2016/0155967 | A1 | 6/2016 | Lee et al. |

FOREIGN PATENT DOCUMENTS

| | | |
|---|---|---|
| CN | 106328003 A | 1/2017 |
| EP | 2894672 A1 | 7/2015 |
| GB | 2493417 A | 2/2013 |
| JP | 2005251671 A | 9/2005 |
| JP | 2010080293 A | 4/2010 |
| JP | 2010282966 A | 12/2010 |
| JP | 2014123068 A | 7/2014 |
| JP | 2015143874 A | 8/2015 |
| JP | 6208705 B2 | 10/2017 |
| KR | 20150084247 A | 7/2015 |
| KR | 1020170001819 A | 1/2017 |
| KR | 1020170018112 A | 2/2017 |
| WO | 2015/078032 A1 | 6/2015 |

OTHER PUBLICATIONS

KIPO office action dated Apr. 14, 2020; Appln. No. 10-2018-7010682.
Korean Office Action dated Apr. 17, 2019; Appl. No. 10-2018-7010682.
The First Russian Office Action dated Dec. 20, 2020; Appln. No. 2018114022.
International Search Report and Written Opinion dated Dec. 4, 2017; PCT/CN2017/097064.
Korean Notice of Allowance dated Aug. 19, 2020; Appln. No. 10-2018-7010682.
The Extended European Search Report dated Oct. 29, 2020; Appln. No. 17851943.5.
Japanese Office Action dated Jul. 5, 2021; Appln. No. 2018-516743.

* cited by examiner

FLEXIBLE DISPLAY PANEL, MANUFACTURING METHOD THEREOF AND FLEXIBLE DISPLAY APPARATUS

The present application claims the priority of the Chinese Patent Application No. 201710094071.6 filed on Feb. 21, 2017, the entirety of which is incorporated herein by reference as a part of the present application.

TECHNICAL FIELD

Embodiments of the present disclosure relate to a flexible display panel, a method for manufacturing a flexible display panel and a flexible display apparatus.

BACKGROUND

A display device is formed on a flexible substrate so as to form a flexible display apparatus, the flexible display apparatus displays information normally even if it is folded or bent, and the flexible display apparatus has a wide application prospect in a field such as portable electronic device.

For example, an organic light-emitting display device (OLED) in a flexible display apparatus mainly includes an organic light-emitting layer made of an organic light emitting material, a cathode layer, an anode layer and a functional layer. An appropriate voltage is applied between the cathode layer and the anode layer, and in this way, holes in the anode and electrons in the cathode are recombined in the organic light-emitting layer to emit light after passing through the functional layer, that is, the OLED device is a self-luminous type display device, a backlight is not necessary in the OLED device, and therefore, the OLED device has features of light weight, thin profile and so on. In addition, the OLED device is portable and flexible.

SUMMARY

At least one embodiment of the present disclosure provides a flexible display panel, and the flexible display panel includes: a flexible substrate; a flexible display screen disposed on the flexible substrate; a protection film disposed at a side of the flexible display screen away from the flexible substrate; and a connection layer sandwiched between the flexible display screen and the protection film, in which the connection layer includes at least a hyperelasticity film.

For example, in the flexible display panel provided by at least one embodiment of the present disclosure, the connection layer is in direct contact with both of the flexible display screen and the protection film.

For example, in the flexible display panel provided by at least one embodiment of the present disclosure, a material of the hyperelasticity film includes at least one of ethylene-propylene rubber, ethylene-butadiene-styrene block copolymer, and styrene-butadiene-styrene block copolymer.

For example, in the flexible display panel provided by at least one embodiment of the present disclosure, the connection layer further includes a first adhesive layer and a second adhesive layer, and the hyperelasticity film is sandwiched between the first adhesive layer and the second adhesive layer.

For example, in the flexible display panel provided by at least one embodiment of the present disclosure, a material of the first adhesive layer and a material of the second adhesive layer include an optical clear adhesive.

For example, in the flexible display panel provided by at least one embodiment of the present disclosure, a material of the protection film includes polyimide, silicon nitride, silicon oxide or silicon oxynitride.

For example, the flexible display panel provided by at least one embodiment of the present disclosure further includes a flexible supporting layer, in which the flexible supporting layer is disposed on a side of the flexible substrate away from the flexible display screen.

For example, the flexible display panel provided by at least one embodiment of the present disclosure further includes a circular polarizer, wherein the circular polarizer is disposed on a side of the flexible display screen away from the flexible substrate.

For example, in the flexible display panel provided by at least one embodiment of the present disclosure, a material of the flexible supporting layer includes polyethylene terephthalate or polyvinyl fluoride.

For example, in the flexible display panel provided by at least one embodiment of the present disclosure, the circular polarizer includes a linear polarizer and a quarter-wavelength optical retardation film which are stacked arranged.

For example, the flexible display panel provided by at least one embodiment of the present disclosure further includes a touch screen, in which the touch screen is disposed on a side of the flexible display screen closer to the protection film.

At least one embodiment of the present disclosure further provides a flexible display apparatus, and the flexible display apparatus includes any one of the flexible display panel mentioned above.

At least one embodiment of the present disclosure further provides a method for manufacturing a flexible display panel, and the method further includes: providing a flexible substrate; forming a flexible display screen on the flexible substrate; forming a connection layer on a side of the flexible display screen away from the flexible substrate; forming a protection film on a side of the connection layer away from the flexible display screen; in which the connection layer includes a hyperelasticity film.

For example, in the manufacturing method provided by at least one embodiment of the present disclosure, a material of the hyperelasticity film includes at least one of ethylene-propylene rubber, ethylene-butadiene-styrene block copolymer, and styrene-butadiene-styrene block copolymer.

For example, in the manufacturing method provided by at least one embodiment of the present disclosure, in which before forming the hyperelasticity film, the method further includes forming a first adhesive layer, and after the hyperelasticity film is formed, the method further includes forming a second adhesive layer.

BRIEF DESCRIPTION OF THE DRAWINGS

In order to clearly illustrate the technical solution of the embodiments of the present disclosure, the drawings of the embodiments will be briefly described in the following, it is obvious that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
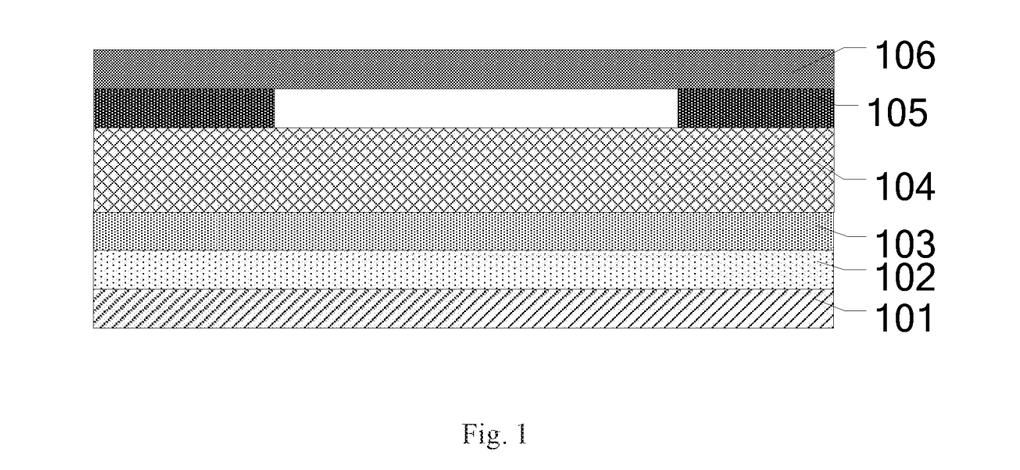
FIG. 1 is a schematic structure view of a flexible display panel.

At present, a flexible display panel is reluctant to return to a flat state after being bent, and there is still a problem that the bending stress occurring between a display device and metal wires is relatively large. Especially, in a case that the flexible display panel is bent into a smaller radius of curvature, the flexible display panel is prone to cracking, peeling, dislocating and so on. For example, FIG. 1 is a schematic structure view of a flexible display panel. As illustrated in FIG. 1, the flexible display panel includes a back plate 101, a display component 102, a touch component 103, a circular polarizer 104 and a protection film 106, and the circular polarizer 104 and the protection film 106 are attached to each other by an optical clear adhesive (OCA). Because the circular polarizer 104 which serves as an anti-reflection component is thick, in the structure as illustrated in FIG. 1, the stress neutral layer is in the circular polarizer 104, and the stress neutral layer is far away from both the display panel and the touch panel, in this way, in a case that the flexible display panel is bent as illustrated in FIG. 1, the required bending force is relatively large, which causes a large damage to the display component 102 and the touch component 103, and after the flexible display panel is bent, its ability to restore deformation is also poor.

It should be noted that, in the process of bending a material layer, the outer layer of the material layer is stretched, the inner layer of the material layer is squeezed, and there is a transition layer in the cross-section of the material that is neither affected by a tensile force nor a squeeze force, the stress in the transition layer is almost zero, and the transition layer is the stress neutral layer of the material layer. That is, the stress neutral layer refers to the plane formed by all the positions where the internal tangential stress is zero while the material layer is bent and deformed. The length of the stress neutral layer during bending is the same as the length of the stress neutral layer before being bent, which remains the same, and the stress neutral layer is the basis for calculating the unfolding length of the bent component.

For example, an embodiment of the present disclosure discloses a flexible display panel, and the flexible display panel includes: a flexible substrate; a flexible display screen disposed on the flexible substrate; a protection film disposed at a side of the flexible display screen facing away from the flexible substrate; and a connection layer sandwiched between the flexible display screen and the protection film, and the connection layer includes at least a hyperelasticity film.

In the present disclosure, the position of the stress neutral layer in the flexible display panel can be changed by the hyperelasticity film disposed in the flexible display panel, and in this way, the damage to the flexible display panel during bending of the flexible display panel is reduced. In addition, the hyperelasticity film can reduce the bending force required for bending the flexible display panel, and improve the ability of the flexible display panel to return to a normal state after being bent.

Figure 2:
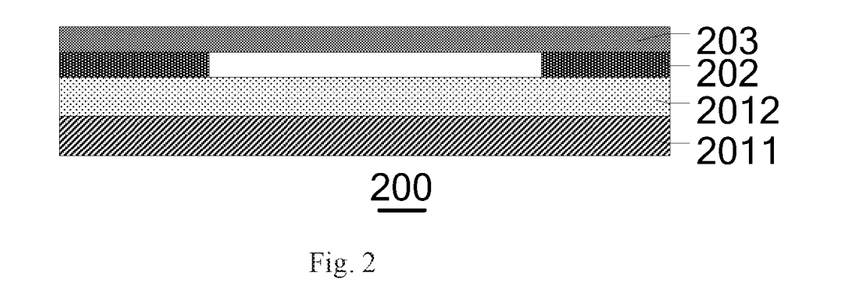
FIG. 2 is a schematic structure view of a flexible display panel provided by an embodiment of the present disclosure.

At least one embodiment of the present disclosure provides a flexible display panel, for example, FIG. 2 is a schematic structure view of a flexible display panel provided by an embodiment of the present disclosure. As illustrated in FIG. 2, the flexible display panel 200 includes: a flexible substrate 2011; a flexible display screen 2012 disposed on the flexible substrate 2011; a protection film 203 disposed at a side of the flexible display screen 2012 facing away from the flexible substrate 2011; and a connection layer 202 sandwiched between the flexible display screen 2012 and the protection film 203. The connection layer 202 includes a hyperelasticity film 2021.

It should be noted that, "hyperelasticity" means the property of large deformation is generated upon a force being applied while restoration of deformation occurs upon the force being released. In general, an elastic material can not be restored to the original shape even if it is deformed by less than 0.5% in shape. In the present specification, a material capable of substantially completely restoring even if it is deformed by greater than 1.0% is referred to as a "hyperelasticity" material. Here "complete" or "completely" means that the material 100% restores to the original state before deformation if it is deformed by greater than 1.0% in shape, further that the material layer substantially 98% restores if it is deformed by greater than 1.0%, further that the material layer substantially 95% restores if it is deformed by greater than 1.0%, or further that the material layer substantially 90% restores if it is deformed by greater than 1.0%.

For example, the connection layer 202 is in direct contact with both of the flexible display 2012 and the protection film 203.

For example, the connection layer 202 is not in direct contact with the flexible display screen 2012 and the protection film 203, it may include other films, and specific films are arranged by those skilled in the art according to actual requirements.

For example, a material of the hyperelasticity film in an embodiment includes at least one of ethylene-propylene rubber, ethylene-butadiene-styrene block copolymer and styrene-butadiene-styrene block copolymer. For example, a material of the hyperelasticity film may be any one of ethylene-propylene rubber, ethylene-butadiene-styrene block copolymer and styrene-butadiene-styrene block copolymer, or a mixture includes any two of ethylene-propylene rubber, ethylene-butadiene-styrene block copolymer and styrene-butadiene-styrene block copolymer, or a mixture of ethylene-propylene rubber, ethylene-butadiene-styrene block copolymer and styrene-butadiene-styrene block copolymer. It should be noted that, the material of the hyperelasticity film is not limited to the above, but may be other suitable material satisfying the above-described hyperelasticity definition.

Figure 3:
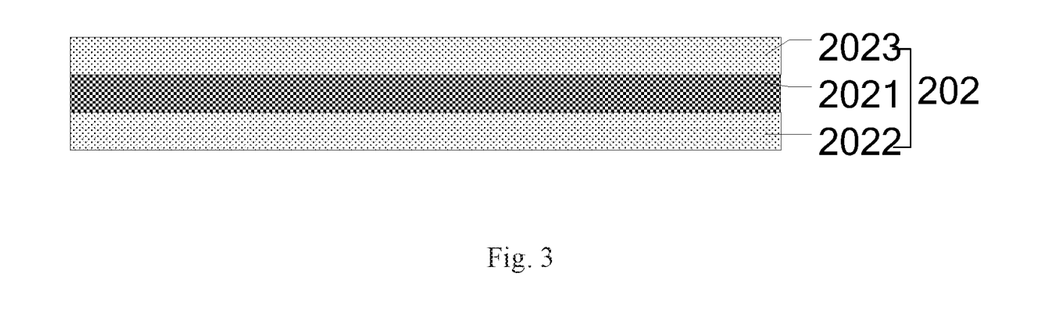
FIG. 3 is a schematic structure view of a connection layer provided by an embodiment of the present disclosure.

For example, FIG. 3 is a schematic structure view of a connection layer provided by an embodiment of the present disclosure. The connection layer 202 further includes a first adhesive layer 2022 and a second adhesive layer 2023, and the hyperelasticity film 2021 is sandwiched between the first adhesive layer 2022 and the second adhesive layer 2023. The triple-layer structure (a sandwich structure) formed by the first adhesive layer 2022, the hyperelasticity film layer 2021 and the second adhesive layer 2023 increases the thickness of the connection layer 202, and the increased thickness of the connection layer 202 also changes the position of the stress neutral layer.

For example, a material of the first adhesive layer and a material of the second adhesive layer include optical clear adhesive, the optical clear adhesive is a transparent adhesive used for bonding the optical components in an electronic equipment, the optical clear adhesive has high transparency, and the optical clear adhesive is an important element adaptable for bonding in an electronic equipment touch screen and a display screen. The material of the optical clear adhesive includes silicone, acrylic resin, unsaturated polyester, polyurethane or epoxy resin.

It should be noted that, at present, the material of the hyperelasticity film is not adhesive, the first adhesive layer 2022 and the second adhesive layer 2023 are formed on two sides of the hyperelasticity film respectively to connect the hyperelasticity film 2021 with other films of the flexible display panel.

For example, the protection film 203 formed on the flexible display screen 201 includes an inorganic material film, an inorganic-organic material mixed film, a stacked structure of inorganic material film—organic material film—inorganic material film, a stacked structure of inorganic organic material mixed film—organic material film—inorganic organic material mixed film; and a stacked structure of inorganic material film—organic material film—inorganic organic material mixed film. For example, the material of the protection film 203 formed on the flexible display screen 201 includes polyimide, silicon nitride, silicon oxide or silicon oxynitride, and may further include aluminum oxide, titanium dioxide, silicon nitride, or silicon carbide or the like inorganic material, or polymethyl methacrylate or the like organic material. The protection film can prevent the flexible display screen from being scratched by an external force, and can also prevent water, oxygen and the like from entering the flexible display panel to cause damages to the flexible display screen. The resistance property of a flexible display screen against oxygen or moisture is a very important parameter, and a flexible display screen is easily affected by oxygen or moisture. The infiltration of oxygen or moisture brings about problems of reducing the performance of the flexible display panel and shortening lifetime of the flexible display panel.

Figure 4:
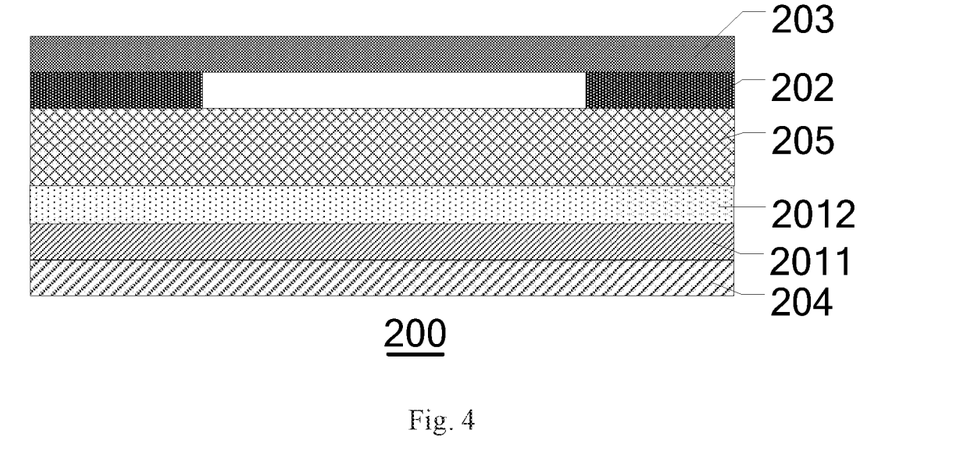
FIG. 4 is a schematic structure view of a flexible display panel provided by another embodiment of the present disclosure.

For example, FIG. 4 is a schematic structure view of a flexible display panel provided by an embodiment of the present disclosure. The flexible display panel further includes a flexible supporting layer 204, and the flexible supporting layer 204 is disposed on a side of the flexible substrate 2011 facing away from the flexible display screen 2012, and the flexible supporting layer 204 supports the flexible display screen 201, and can further prevent water, oxygen and the like from entering the flexible display panel to cause damages to the flexible display screen.

For example, as illustrated in FIG. 4, the flexible display panel 200 further includes a circular polarizer 205, and the circular polarizer 205 is disposed on the side of the flexible display screen facing away from the flexible substrate 2011.

For example, the material of the flexible supporting layer 204 includes polyethylene terephthalate or polyvinyl fluoride. The above-mentioned polyethylene terephthalate and polyvinyl fluoride materials are colorless transparent materials, the light transmittance of the flexible supporting layer 204 is greater than 90%. It should be noted that, the material of the flexible supporting layer 204 is not limited to the above two materials, but may be other transparent flexible materials that support the flexible display screen.

For example, the circular polarizer includes a linear polarizer and a quarter-wavelength optical retardation film which are stacked together. For example, the circular polarizer 205 mainly plays the role of preventing the reflected light from passing through, the circular polarizer 205 mainly includes a retardation film and a polarizing functional film, the retardation film is at the light-emitting side of the circular polarizer film, and the polarizing functional film is at the light-incident side of the circular polarizer film. The main function of the polarizing functional film is to convert natural light passing through the polarizing functional film into linear polarized light; preferably, the retardation film is a quarter-wavelength optical retardation film, and the main function of the quarter-wavelength optical retardation film is to change linearly polarized light into circularly polarized light or change circularly polarized light into linearly polarized light. Combining the polarizing functional film with the retardation film, and natural light is incident from the polarizing functional film and is changed into linearly polarized light after passing through the polarizing functional film, and then the linearly polarized light passes through the retardation film layer and is changed into left-handed circularly polarized light; then, when the left-handed circularly polarized light is reflected back, it becomes right-handed circularly polarized light and the right-handed circularly polarized light passes through the retardation film again and is changed to linearly polarized light, in this way, the linearly polarized light at this moment is perpendicular to the linearly polarized light before, and the linearly polarized light at this moment can not pass through the linear polarizer, and therefore, the reflected light can not pass through the polarizing functional layer, and the influence of ambient light is reduced and the contrast ratio is improved.

For example, the material of the polarizing functional film layer is polyvinyl alcohol (PVA) or carbon nanotube (CNT), which is not limited herein. Because carbon nanotubes have a self-supporting characteristics, in a case that the carbon nanotube is used for preparing the polarizing functional film of the circular polarizer film, the flexible supporting layer can be omitted.

Figure 5:
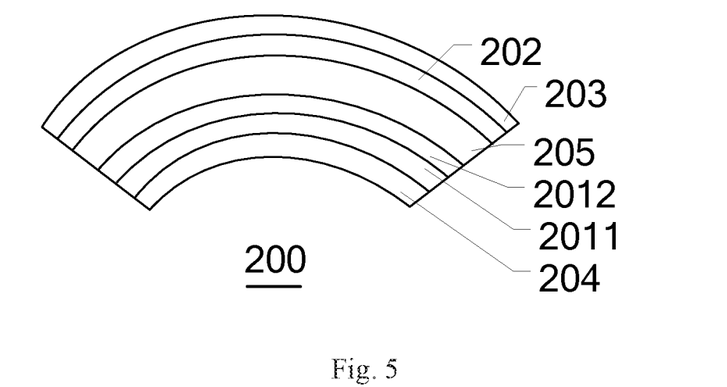
FIG. 5 is a schematic structure view of the flexible display panel in FIG. 4 after being bent.

For example, FIG. 5 is a schematic structure view of the flexible display panel in FIG. 4 after being bent, it can be seen from FIG. 5, the outer layer of the flexible display panel is subjected to a tensile force and the inner layer of the flexible display panel is squeezed. The mechanical simulation of the stacked films is performed on the structure of the flexible display panel as illustrated in FIG. 4 and shows that, in a case that the connection layer 202 is formed by the triple-layer structure of the first adhesive layer 2022, the hyperelasticity film layer 2021 and the second adhesive layer 2023, the stress neutral layer is between the flexible display screen 201 and the circular polarizer 205, and the stress neutral layer is closer to the flexible display screen 201, in this way, when the flexible display panel is bent, the flexible display screen 201 is hard to be damaged; in contrast, if a normal connection layer is used, the stress neutral layer is on a side of the circular polarizer 205 away from the flexible display screen 201, and because the circular polarizer 205 is thick, the stress neutral layer is farther away from the flexible display screen 201, the flexible display screen 201 tends to be damaged during the flexible display panel being bent.

Figure 6:
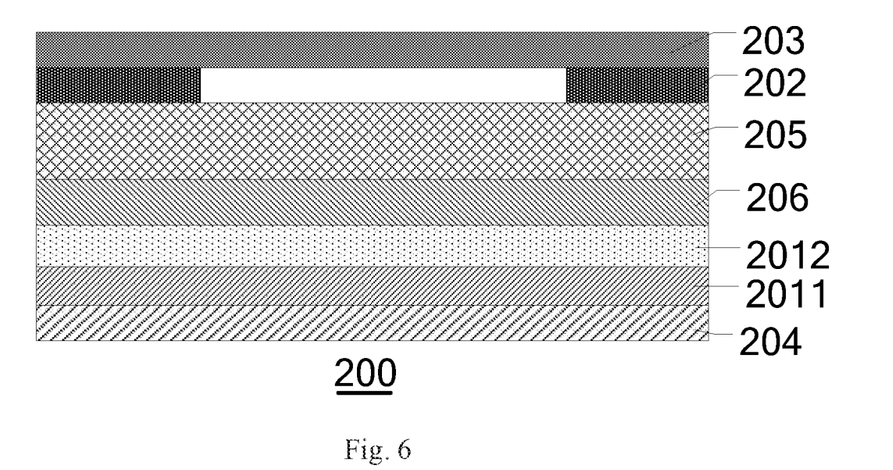
FIG. 6 is a schematic structure view of a flexible display panel provided by still another embodiment of the present disclosure.

For example, FIG. 6 is a schematic structure view of a flexible display panel provided by still another embodiment of the present disclosure. As illustrated in FIG. 6, the flexible display panel further includes a touch screen 206, and the touch screen 206 is disposed on a side of the flexible display screen 201 closer to the protection film 203, that is, the touch screen 206 is disposed between the flexible display screen 201 and the circular polarizer 205. The flexible display panel as shown in FIG. 6 can implement a touch function and a display function simultaneously.

Figure 7:
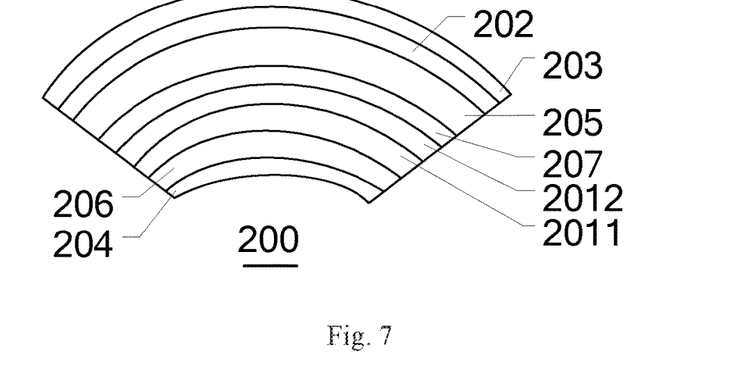
FIG. 7 is a schematic structure view of the flexible display panel in FIG. 6 after being bent.

For example, FIG. 7 is a schematic structure view of the flexible display panel in FIG. 6 after being bent, the mechanical simulation of the stacked films is performed on the structure of the flexible display panel as illustrated in FIG. 6 and shows that, in a case that the connection layer 202 is formed by the triple-layer structure of the first adhesive layer 2022, the hyperelasticity film layer 2021 and the second adhesive layer 2023, the stress neutral layer is on the touching screen 206, and the stress neutral layer is closer to both of the flexible display screen 201 and the touching screen 206, in this way, when the flexible display panel is bent, both the flexible display screen 201 and the touching screen 206 are hard to be damaged; in contrast, if a normal connection layer is used, the stress neutral layer is on a side of the circular polarizer 205, and because the circular polarizer 205 is thick, the stress neutral layer is farther away from the flexible display screen 201, the flexible display screen 201 tends to be damaged during the flexible display panel being bent. For example, for a normal connection layer, the average deformation of the flexible display screen is 0.92%; for the hyperelasticity film 2021 provided by the embodiment of the present disclosure, the average deformation of the flexible display screen shown in FIG. 7 is 0.68%, that is, compared with the flexible display panel formed by using a normal connection layer, the deformation of the flexible display panel in the embodiment of the present disclosure is reduced by 26%, thereby the bendability of the flexible display panel is improved.

For example, the flexible substrate 2011 for a flexible display screen requires a better performance in terms of surface topography, thermal stability, lower thermal expansion coefficient, reliability, and so on. For example, the flexible substrate used in a flexible display screen includes an organic plastic substrate, for example, that made of polycarbonate (PC), polyethylene terephthlate (PET), polyethylene naphthalate (PEN), polyether sulfone (PES), polyimide (PI) or the like.

For example, the flexible substrate of the flexible display screen has a coefficient of expansion of 1 ppm/° C. to 70 ppm/° C., for example, 10 ppm/° C., 30 ppm/° C., 50 ppm/° C., 60 ppm/° C. and 70 ppm/° C.

Figure 8:
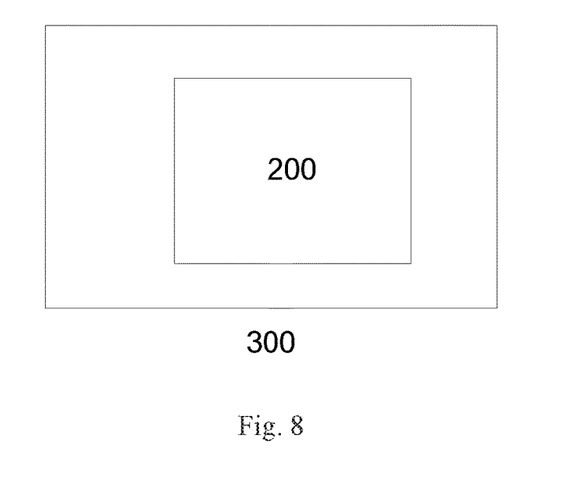
FIG. 8 is a schematic structure view of a flexible display apparatus provided by an embodiment of the present disclosure.

At least one embodiment of the present disclosure further provides a flexible display apparatus. For example, FIG. 8 is a schematic structure view of a flexible display device provided by an embodiment of the present disclosure. The flexible display apparatus 300 includes any one of the flexible display panels mentioned above. The flexible display apparatus provided in an embodiment of the present disclosure also has the same technical effect as the above mentioned flexible display panel. That is, the position of the stress neutral layer in the flexible display panel in the flexible display apparatus can be changed by the hyperelasticity film disposed in the flexible display panel, then the damages to the flexible display panel during bending of the flexible display panel is reduced. In addition, the hyperelasticity film further reduces the bending force required for bending the flexible display apparatus, and improves the ability of the flexible display apparatus to be bent and of deformation restoration.

For example, other structures in the flexible display apparatus 300 can refer to conventional designs. The display apparatus can be a mobile phone, a tablet computer, a television, a display, a notebook computer, a digital picture frame, a navigation system or any other product or component having a display function.

Figure 9:
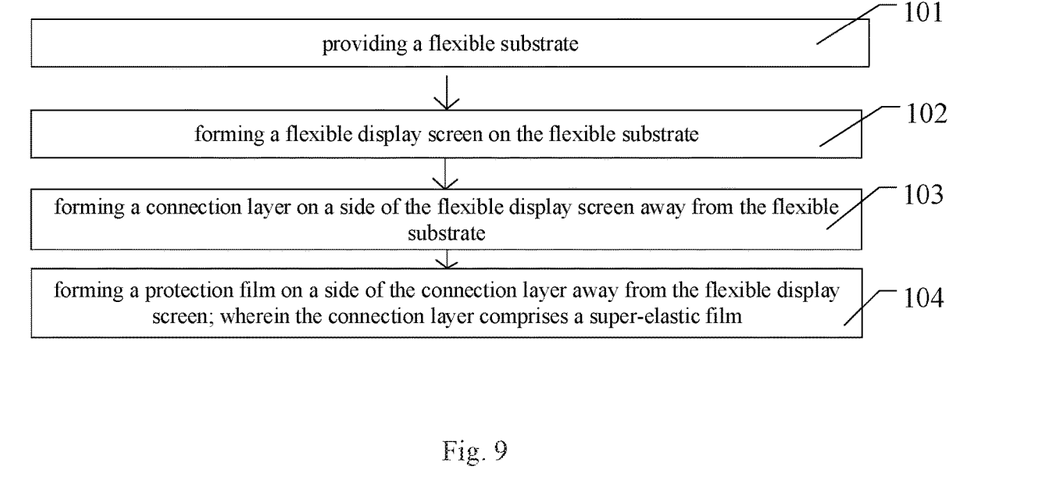
FIG. 9 is a flow view of a method for manufacturing a flexible display panel provided by an embodiment of the present disclosure.

At least one embodiment of the present disclosure further provides a method for manufacturing a flexible display panel. For example, FIG. 9 is a flow view of a method for manufacturing a flexible display panel provided by an embodiment of the present disclosure, and the manufacturing method includes:

Step 101: providing a flexible substrate;

Step 102: forming a flexible display screen on the flexible substrate;

Step 103: forming a connection layer on a side of the flexible display screen away from the flexible substrate; and Step 104: forming a protection film on a side of the connection layer away from the flexible display screen, in which the connection layer includes a hyperelasticity film.

For example, a material of the hyperelasticity film includes at least one of ethylene-propylene rubber, ethylene-butadiene-styrene block copolymer and styrene-butadiene-styrene block copolymer. For example, a material of the hyperelasticity film may be any one of ethylene-propylene rubber, ethylene-butadiene-styrene block copolymer and styrene-butadiene-styrene block copolymer, or a mixture includes any two of ethylene-propylene rubber, ethylene-butadiene-styrene block copolymer and styrene-butadiene-styrene block copolymer, or a mixture of ethylene-propylene rubber, ethylene-butadiene-styrene block copolymer and styrene-butadiene-styrene block copolymer. It should be noted that, the material of the hyperelasticity film is not limited to this, but may be other suitable materials satisfying the above hyperelasticity definition.

For example, the connection layer further includes a first adhesive layer and a second adhesive layer, and the hyperelasticity film is sandwiched between the first adhesive layer and the second adhesive layer. The triple-layer structure formed by the first adhesive layer, the hyperelasticity film layer and the second adhesive layer increases the thickness of the connection layer, and the increased thickness of the connection layer changes the position of the stress neutral layer.

For example, a material of the first adhesive layer and a material of the second adhesive layer includes an optical clear adhesive, the optical clear adhesive is a transparent adhesive used for bonding the optical components in the electronic equipment, the optical clear adhesive has high transparency, and the optical clear adhesive is an important element adaptable for bonding in an electronic equipment touch screen and a display screen. The material of the optical clear adhesive includes silicone, acrylic resin, unsaturated polyester, polyurethane or epoxy resin.

It should be noted that, at present the material of the hyperelasticity film is not adhesive, and the first adhesive layer and the second adhesive layer are formed on two sides of the hyperelasticity film respectively to connect the hyperelasticity film with other films of the flexible display panel.

For example, the protection film formed on the flexible display screen includes an inorganic material film, an inorganic-organic material mixed film, a stacked structure of inorganic material film—organic material film—inorganic material film, a stacked structure of inorganic organic material mixed film—organic material film—inorganic organic material mixed film; and a stacked structure of inorganic material film—organic material film—inorganic organic material mixed film. For example, the material of the protection film formed on the flexible display screen includes polyimide, silicon nitride, silicon oxide or silicon oxynitride, and may further include aluminum oxide, titanium dioxide, silicon nitride, or silicon carbide or the like inorganic material, or polymethyl methacrylate or the like organic material. The protection film can prevent the flexible display screen from being scratched by an external force, and can also prevent water, oxygen and the like from entering the flexible display panel to cause damages to the flexible display screen. The resistance property of a flexible display screen against oxygen or moisture is a very important parameter, and a flexible display screen is easily affected by oxygen or moisture. The infiltration of oxygen or moisture brings about problems of reducing the performance of the flexible display panel and shortening lifetime of the flexible display panel.

The flexible display panel, the method for manufacturing a flexible display panel and the flexible display apparatus provided by the embodiment of the present disclosure have at least one of the following beneficial effects:

(1) in the flexible display panel provided by at least one embodiment of the present disclosure, the position of the stress neutral layer in the flexible display panel in the flexible display apparatus can be changed by the hyperelasticity film disposed in the flexible display panel, then the damages to the flexible display panel during bending of the flexible display panel is reduced;

(2) in the flexible display panel provided by at least one embodiment of the present disclosure, the hyperelasticity film reduces the bending force required for bending the flexible display panel, and improves the ability of the flexible display panel to bend and of deformation restoration.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

What is claimed is:

1. A flexible display panel, comprising:
   a flexible substrate;
   a flexible display screen on the flexible substrate;
   a protection film disposed at a side of the flexible display screen away from the flexible substrate; and
   a connection layer sandwiched between the flexible display screen and the protection film, wherein the connection layer comprises at least a hyperelasticity film,
   wherein the flexible display panel further comprises a circular polarizer, and the circular polarizer is disposed on a side of the flexible display screen, away from the flexible substrate,
   the flexible display panel is a flexible organic light-emitting display panel,
   the circular polarizer is between the flexible display screen and the connection layer, and
   a stress neutral layer of the flexible display panel is between the flexible display screen and the circular polarizer.

2. The flexible display panel according to claim 1, wherein the connection layer is in direct contact with both of the flexible display screen and the protection film.

3. The flexible display panel according to claim 1, wherein a material of the hyperelasticity film comprises at least one of ethylene-propylene rubber, ethylene-butadiene-styrene block copolymer, and styrene-butadiene-styrene block copolymer.

4. The flexible display panel according to claim 1, wherein the connection layer further comprises a first adhesive layer and a second adhesive layer, and the hyperelasticity film is sandwiched between the first adhesive layer and the second adhesive layer.

5. The flexible display panel according to claim 4, wherein a material of the first adhesive layer and a material of the second adhesive layer comprise an optical clear adhesive.

6. The flexible display panel according to claim 1, wherein a material of the protection film comprises polyimide, silicon nitride, silicon oxide or silicon oxynitride.

7. The flexible display panel according to claim 1, further comprising a flexible supporting layer, wherein the flexible supporting layer is disposed on a side of the flexible substrate away from the flexible display screen.

8. The flexible display panel according to claim 7, wherein a material of the flexible supporting layer comprises polyethylene terephthalate or polyvinyl fluoride.

9. The flexible display panel according to claim 1, wherein the circular polarizer comprises a linear polarizer and a quarter-wavelength optical retardation film which are stacked arranged.

10. The flexible display panel according to claim 1, further comprising a touch screen, wherein the touch screen is disposed on a side of the flexible display screen closer to the protection film.

11. A flexible display apparatus, comprising the flexible display panel according to claim 1.

12. A method for manufacturing a flexible display panel, comprising:
providing a flexible substrate;
forming a flexible display screen on the flexible substrate;
forming a connection layer on a side of the flexible display screen away from the flexible substrate; and
forming a protection film on a side of the connection layer away from the flexible display screen; wherein the connection layer comprises a hyperelasticity film,
wherein the flexible display panel further comprises a circular polarizer, and the circular polarizer is disposed on a side of the flexible display screen away from the flexible substrate,
the flexible display panel is a flexible organic light-emitting display panel,
the circular polarizer is between the flexible display screen and the connection layer, and
a stress neutral layer of the flexible display panel is between the flexible display screen and the circular polarizer.

13. The manufacturing method according to claim 12, wherein a material of the hyperelasticity film comprises at least one of ethylene-propylene rubber, ethylene-butadiene-styrene block copolymer, and styrene-butadiene-styrene block copolymer.

14. The manufacturing method according to claim 12, wherein before forming the hyperelasticity film, the method further comprises forming a first adhesive layer, and
after the hyperelasticity film is formed, the method further comprises forming a second adhesive layer.

15. The flexible display panel according to claim 2, wherein the connection layer further comprises a first adhesive layer and a second adhesive layer, and the hyperelasticity film is sandwiched between the first adhesive layer and the second adhesive layer.

16. The flexible display panel according to claim 2, wherein a material of the protection film comprises polyimide, silicon nitride, silicon oxide or silicon oxynitride.

17. The flexible display panel according to claim 2, further comprising a flexible supporting layer, wherein the flexible supporting layer is disposed on a side of the flexible substrate away from the flexible display screen.

* * * * *